United States Patent
Mathieu et al.

(10) Patent No.: US 11,894,295 B2
(45) Date of Patent: Feb. 6, 2024

(54) PROCESS FOR MANUFACTURING A CHIP-CARD MODULE WITH SOLDERED ELECTRONIC COMPONENT

(71) Applicant: Linxens Holding, Mantes la Jolie (FR)

(72) Inventors: Christophe Mathieu, Mantes la Jolie (FR); Guillaume Gimbert, Vorey (FR)

(73) Assignee: Linxens Holding, Mantes-la-Jolie (FR)

( * ) Notice: Subject to any disclaimer, the term of this patent is extended or adjusted under 35 U.S.C. 154(b) by 30 days.

(21) Appl. No.: 17/452,131

(22) Filed: Oct. 25, 2021

(65) Prior Publication Data

US 2022/0139818 A1     May 5, 2022

(30) Foreign Application Priority Data

Oct. 30, 2020    (FR) ................................ 2011177

(51) Int. Cl.
| | |
|---|---|
| H01L 23/498 | (2006.01) |
| G06K 19/077 | (2006.01) |
| H01L 21/48 | (2006.01) |
| H01L 21/56 | (2006.01) |
| H01L 23/31 | (2006.01) |
| H01L 23/00 | (2006.01) |
| B23K 101/40 | (2006.01) |

(Continued)

(52) U.S. Cl.
CPC .. *H01L 23/49855* (2013.01); *G06K 19/07722* (2013.01); *H01L 21/4853* (2013.01); *H01L 21/565* (2013.01); *H01L 23/3121* (2013.01); *H01L 23/49838* (2013.01); *H01L 24/13* (2013.01); *H01L 24/16* (2013.01); *H01L 24/48* (2013.01); *H01L 24/81* (2013.01); *B23K 35/262* (2013.01); *B23K 2101/40* (2018.08); *C22C 13/00* (2013.01); *H01L 2224/13211* (2013.01); *H01L 2224/13213* (2013.01); *H01L 2224/13239* (2013.01); *H01L 2224/13247* (2013.01); *H01L 2224/16227* (2013.01); *H01L 2224/48227* (2013.01); *H01L 2224/81815* (2013.01); *H01L 2924/014* (2013.01); *H01L 2924/0105* (2013.01); *H01L 2924/01029* (2013.01); *H01L 2924/01047* (2013.01); *H01L 2924/01083* (2013.01)

(58) Field of Classification Search
None
See application file for complete search history.

(56) References Cited

U.S. PATENT DOCUMENTS

| | | | |
|---|---|---|---|
| 10,804,594 B2* | 10/2020 | Janvrin | ................ H01Q 1/2208 |
| 2006/0237542 A1 | 10/2006 | Launay et al. | ................. 235/492 |
| 2018/0082165 A1* | 3/2018 | Mosteller | ........... G06K 19/0718 |

(Continued)

FOREIGN PATENT DOCUMENTS

| | | |
|---|---|---|
| CA | 2 503 688 A1 | 5/2004 |
| EP | 3 182 507 A1 | 6/2017 |
| WO | WO 2017/102749 A1 | 6/2017 |

*Primary Examiner* — Long Pham
(74) *Attorney, Agent, or Firm* — Harrington & Smith

(57) ABSTRACT

Process for manufacturing a chip-card module. It includes one or more operations in which a meltable solder is deposited on connection pads formed in a layer of electrically conductive material located on the back side of a dielectric substrate, and at least one electronic component is connected to these connection pads by reflowing the solder. Chip-card module obtained using this process. Chip card including such a module.

7 Claims, 4 Drawing Sheets

(51) Int. Cl.
*B23K 35/26* (2006.01)
*C22C 13/00* (2006.01)

(56) References Cited

U.S. PATENT DOCUMENTS

2018/0281243 A1* 10/2018 Zenou .................... G03F 7/0002
2018/0351233 A1   12/2018 Janvrin et al.
2019/0294943 A1*  9/2019 Ng ................... G06K 19/07769
2019/0340398 A1* 11/2019 Mosteller ........... G06K 7/10366

* cited by examiner

[Fig. 1]
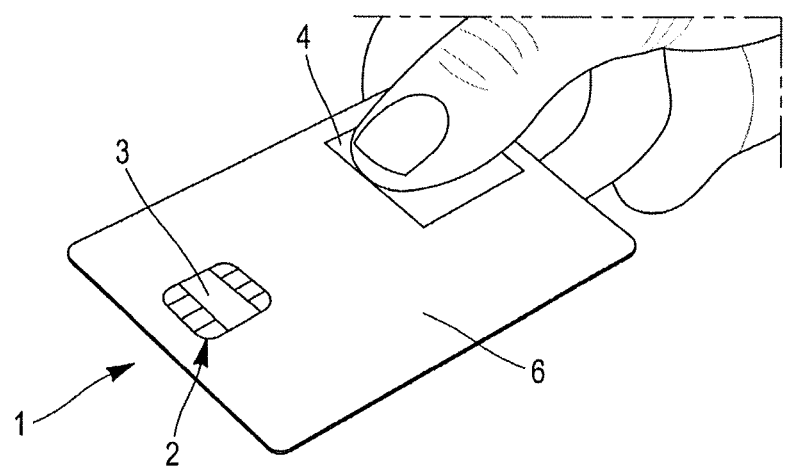
[Fig. 2]
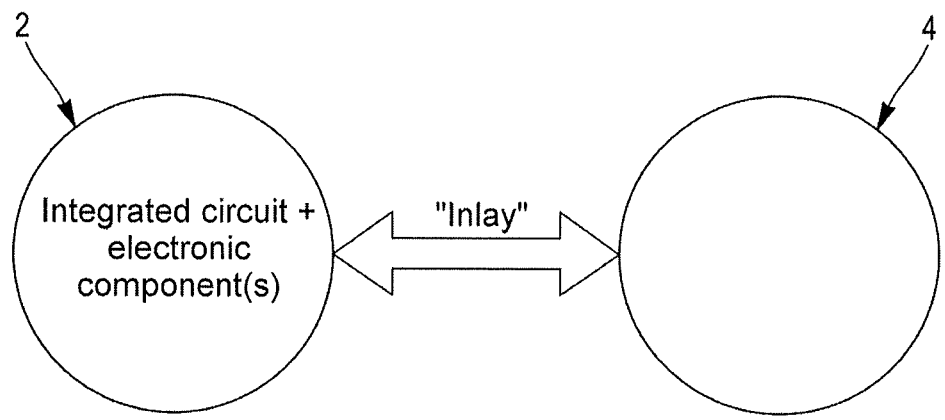

[Fig. 3]
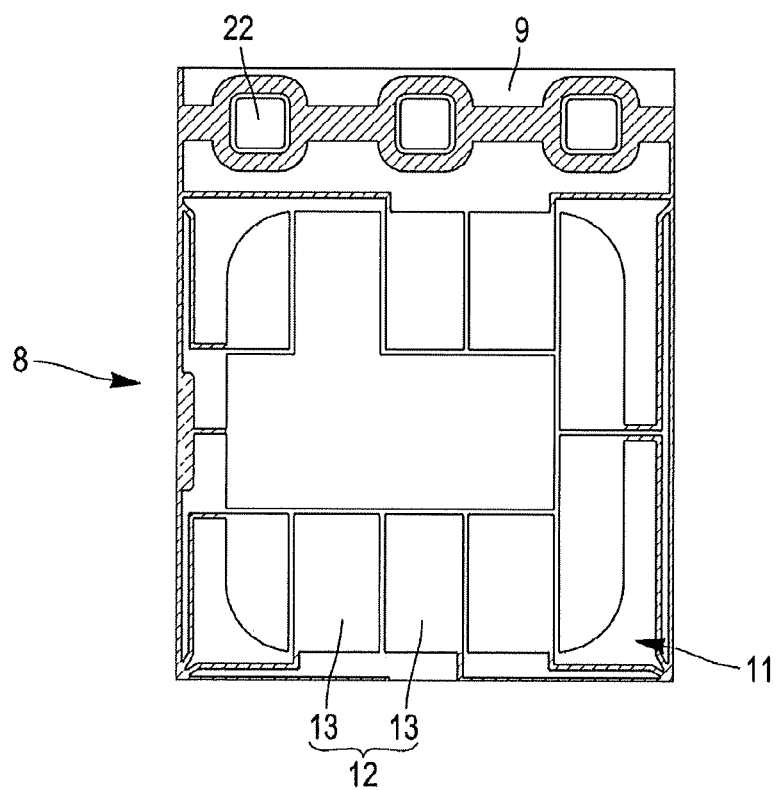

[Fig. 4]
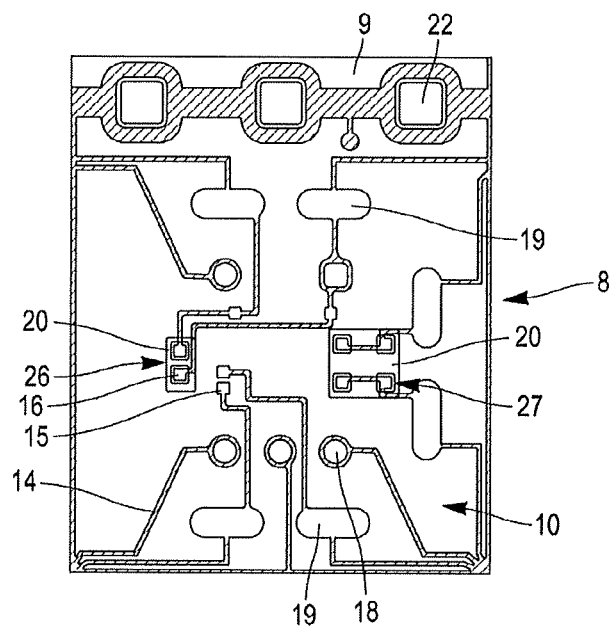
[Fig. 5]
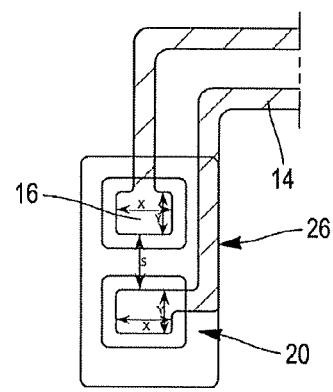

PROCESS FOR MANUFACTURING A CHIP-CARD MODULE WITH SOLDERED ELECTRONIC COMPONENT

TECHNICAL FIELD

The invention relates to the field of chip cards.

PRIOR ART

Chip cards are generally formed from a plastic card body in which is housed a module comprising a chip, i.e. an integrated circuit, that is electrically connected to contacts and/or to an antenna with a view to communication, with or without contact, with a card reader. Apart from an antenna and a module comprising a chip, other circuitry elements and/or other electronic components may be integrated into the card body. This is notably the case when biometric sensors for reading fingerprints are used to increase security or to simplify the use of chip cards.

However, the integration of electronic components into the body of a chip card may lead to problems during the lamination of the various constituent layers of the card body. Specifically, problems potentially encountered include, for example, deterioration of the components during the lamination, the unsightly bulge that may result from the insertion of the one or more components between the layers, and the imprecision after lamination in the position of the connection regions intended for the connection of the electronic components.

One solution consists in integrating at least certain components into a module already comprising the chip or intended to receive the chip (for example reference may be made to documents US2019294943A1, CA2503688A1 and US2019340398A1 for examples of chip cards with a plurality of components on a module). Specifically, this module is housed in a cavity, which is generally milled into the body of the card, after lamination of the constituent layers of the latter. Thus, for example, the components are not subjected to a laminating operation.

The invention addresses this context and aims to contribute at least partially to the improvement of processes for manufacturing chip-card modules comprising components in addition to the chip conventionally borne by such modules.

SUMMARY OF THE INVENTION

Thus, according to the invention, a process is provided for manufacturing a module for a chip card, comprising operations consisting
in providing a dielectric substrate bearing a first layer of electrically conductive material on a first main face of the substrate, and a second layer of electrically conductive material on a second main face of the substrate, and
in fastening an integrated circuit to the substrate, on the side of its first main face, and in connecting this integrated circuit to first connection pads.

This process further comprises one or more operations in which a meltable solder is deposited on second connection pads formed in the first layer of electrically conductive material and at least one electronic component is connected to the second connection pads by reflowing the solder deposited beforehand on the second connection pads.

Thus, by virtue of the invention, it is possible to use electronic components, which are possibly sensitive to lamination, in the manufacture of chip-card modules. The integrated circuit may be connected using a wire-bonding or a flip-chip technology. When the chip is connected using a flip-chip technology, the connection may be made using a conductive paste, or even using a meltable solder and an operation of reflowing the latter (optionally the same operation as that allowing the one or more other electronic components to be connected). When the chip is connected using wire bonding, the combination of two connection techniques, namely wire bonding and reflow soldering, on a given carrier goes against the prejudices of those skilled in the art, who believe that a reflow step prior to the wire bonding is liable to contaminate the connection pads intended for the wire bonding, or, in contrast, that the reflow temperature may degrade the chip if the latter is connected beforehand.

This process for manufacturing a chip-card module optionally comprises one or more than one of the following features, each considered independently of the others, or each in combination with one or more of the others:
it comprises an operation in which a solder mask is deposited on the first main face of the substrate before the solder is reflowed;
the operation of reflowing the solder is carried out before the operation in which the integrated circuit is connected to the first connection pads; alternatively, the operation of reflowing the solder material is carried out after the operation in which the integrated circuit is connected to the first connection pads;
the integrated circuit is connected to the first connection pads, using wires;
the solder has a melting point comprised between 130 and 250° C.;
the solder is deposited using a technique chosen from the following list: jetting, contact dispensing, pin transfer and screen-printing;
it comprises an operation of depositing an encapsulating material on the integrated circuit and the wires connecting this integrated circuit to the first connection pads, without covering the electronic component with this encapsulating material.

According to yet another aspect, the invention relates to a chip-card module comprising a dielectric substrate bearing a first layer of electrically conductive material on a first main face of the substrate, a second layer of electrically conductive material on a second main face of the substrate, an integrated circuit securely fastened to the substrate, on the side of its first main face, and connected, optionally using wires, to first connection pads. This module further comprises at least one solderable electronic component connected to second connection pads formed in the first layer of electrically conductive material, using a meltable solder deposited and reflowed on the solder-connection second pads.

This chip card module optionally comprises one and/or another of the following features, each considered independently of one another, or each in combination with one or more others:
the electronic component is a passive component;
the solder is an alloy that may be an alloy comprising at least two elements from the following list: bismuth, tin, silver and copper;
an encapsulating material surrounds the integrated circuit, without covering the electronic component.

According to yet another aspect, the invention relates to a chip card comprising a card body and a cavity in which is housed a module manufactured using a process according to the invention.

BRIEF DESCRIPTION OF THE FIGURES

Further aspects, aims and advantages of the invention will become apparent on reading the following detailed description, with reference to the appended drawings, which are given by way of non-limiting examples and in which:

FIG. 1 schematically shows in perspective an example of a chip card;

FIG. 2 schematically shows an example of organisation of the circuitry and of the components in a chip card such as that illustrated in FIG. 1;

FIG. 3 schematically shows, in elevation, a segment of a printed circuit board corresponding to an example of an embodiment of a module according to the invention, seen via its front side;

FIG. 4 schematically shows, in elevation, a segment of a printed circuit board corresponding to the example of an embodiment of the module illustrated in FIG. 3, seen via its back side;

FIG. 5 schematically shows a detail of FIG. 4;

DETAILED DESCRIPTION

Figure 6:
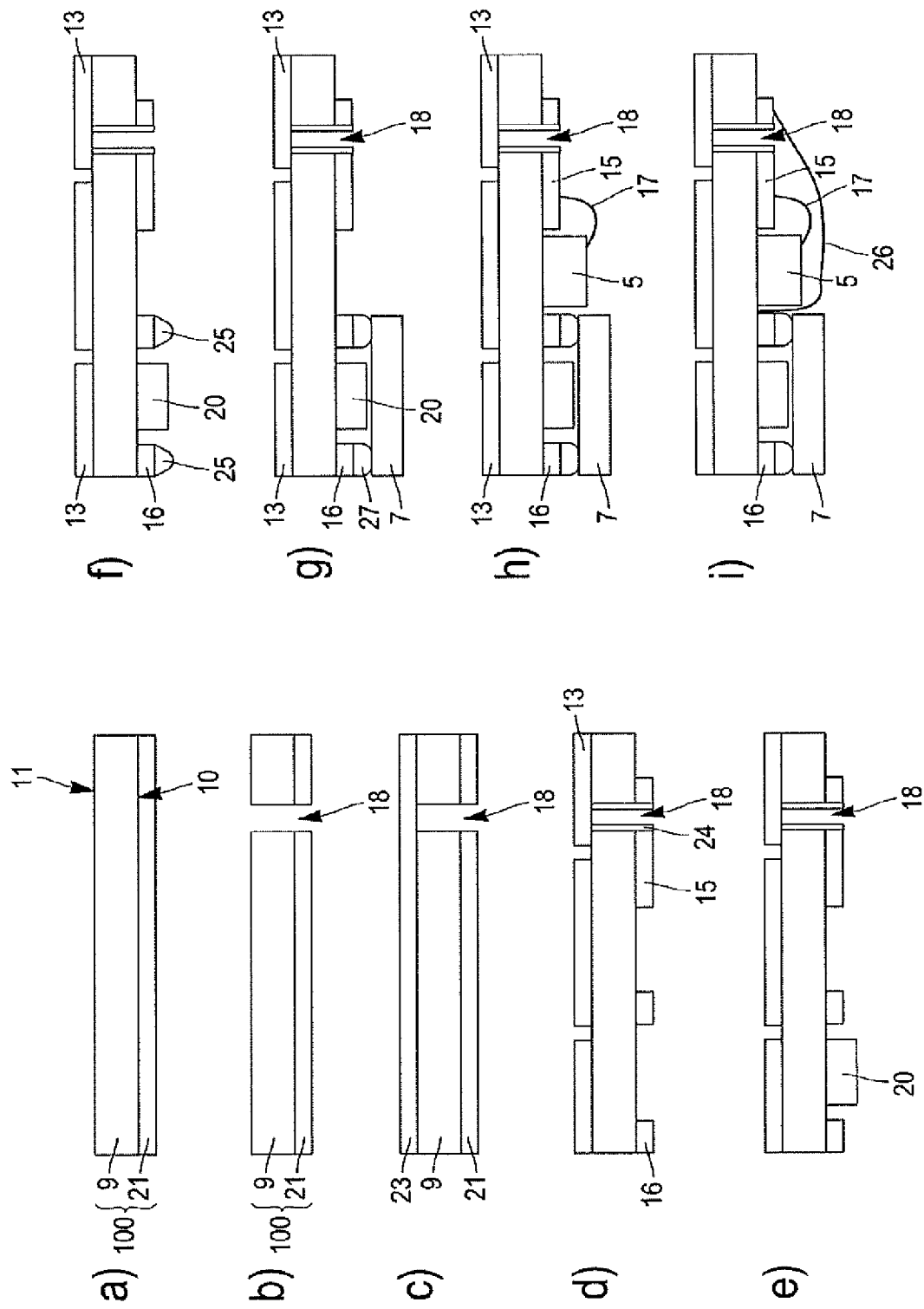
FIG. 6 schematically shows various steps of an example of a process for manufacturing a chip-card module, according to the invention.

One example of a chip card 1 according to the invention is shown in FIG. 1. In this example, the chip card 1 is a bank card in the ID-1 format. This card chip 1 comprises a first module 2 comprising a connector 3 and a second module 4. The first module 2 is for example an EMV module (EMV standing for EuroPay MasterCard Visa) meeting standard ISO 7810. The connector 3 allows an electronic chip 5 (see FIG. 6) mounted on the first module 2 to be electrically connected to a card reader with a view to exchanging data between the chip 5 and the card reader.

In the case of a dual-interface chip card 1, i.e. a chip card able to be read with or without contact, an antenna is integrated into the body 6 of the chip card 1. This antenna is for example connected to the chip located in the first module 2. This antenna allows data to be exchanged contactlessly between the chip 5 and a contactless card reader. This antenna, or another portion of an electrical circuit located in the card body 6, may also be electrically connected to the second module 4 integrated into the chip card 1. The second module 4 is for example a biometric module. This second module 4 then for example comprises a biometric sensor for recognising fingerprints. The second module 4 for example makes it possible to determine whether the fingerprint read by the biometric sensor corresponds to the fingerprint of a user who is authorized to use this chip card 1. In this case, contactless communication between the chip 5 and a reader may be permitted. Other components (a light-emitting diode for example) are optionally housed in the card body 6.

As illustrated in FIG. 2, the first and second modules 2, 4 communicate via an electrical circuit produced on an inlay formed using a dielectric carrier. This electrical circuit may be formed using one or more conductive wires embedded in the dielectric carrier, or indeed using conductive tracks etched in a layer of conductive material laminated with the dielectric carrier, or else using conductive tracks that are cut from a layer of conductive material before being laminated to the dielectric carrier. The inlay and its electrical circuit are then laminated with various plastic layers (one or more compensating layers, one or more finishing layers, one or more printing layers, etc.) to form a card body 6. As known, cavities are produced by milling in the card body 6. The first and second modules 2, 4 are integrated into these cavities, in which cavities they are connected to the electrical circuit previously incorporated into the card body 6.

One advantage of the invention is that it allows one or more electronic components 7 that it is preferable not to place in the card body 6 to be grouped together in the first module 2. To do this, the first module 2 is manufactured in a specific way.

FIGS. 3 to 5 show a segment of a printed circuit board 8. This segment corresponds to the region of the printed circuit board 8 that is intended to form a module, but the printed circuit board 8 comprises many identical or similar regions to the one shown in these figures. These regions repeat with a given pitch over the width of a printed-circuit-board strip, and optionally with another pitch over the length of this printed-circuit-board strip. The strip is continuously processed reel-to-reel using a process one of example of which is described below.

The first module 2 comprises a dielectric carrier or substrate 9. This dielectric substrate 9 has two main faces: a first face, called the "back side" or "bonding side", and a second face 11, called the "front side" or "contact side". Conductive lands 12 are produced on each of the first and second faces 10, 11, using a process described below. On the second face 11 (front side), the conductive lands 12 essentially correspond to contacts 13 intended to establish a temporary communication via contact with a card reader. On the first face 10 (back side), the conductive lands 12 correspond to tracks 14 and connection pads 15, 16. The connection pads 15, 16 serve to connect the chip and the one or more electronic components 7 fastened to the first face 10. Some of the first connection pads 15 are used for the connection, using electrically conductive connection wires 17 (see FIG. 6), of the chip 5 to the conductive tracks 14. Some of the second connection pads 16 are used for the connection by soldering of the one or more electronic components 7 to the conductive tracks 14. Moreover, the conductive tracks 14 electrically connect the first and second pads 15, 16 to connection lands 19 intended to connect the first module 2 to the electrical circuit integrated into the card body 6, or to connection wells 18 allowing a connection to be made, through the substrate 9, with the contacts 13.

As illustrated in FIGS. 4 and 5, a solder mask 20 is placed around the second connection pads 16. The solder mask is deposited on the substrate 9. It partially covers conductive tracks 14 connected to the second connection pads 16, but leaves the second connection pads 16 uncovered. In the NSMD configuration (NSMD standing for Non Solder Mask Defined) a space the width of which is for example comprised between 50 and 200 µm is left, around the second connection pads 16, between the second connection pads 16 and the solder mask 20. In the SMD configuration (SMD standing for Solder Mask Defined) a region of overlap the width of which is for example comprised between 50 and 200 µm covers the second connection pads 16.

It is known that during the implementation of SMT processes (SMT standing for Surface Mount Technology) an undesirable effect may occur during the reflow operation intended to solder the terminals of a component to printed-circuit-board pads. This undesirable effect, known as tombstone or the Manhattan effect or even chip lifting, causes the component to revolve away from the plane of the printed circuit board. One of the terminals of the revolved component may be connected by solder but the other disconnected (out of the reflowed solder). FIG. 5 shows a segment of printed circuit board, in the vicinity of the second connection pads 16. These connection pads 16 have a length X, a width Y and are spaced apart by a distance S.

The inventors have observed that with a value of X equal to 400 µm, a value equal to Y of 400 µm and a distance S equal to 400 µm, the tombstone effect occurs in more than 10% of cases, for a component of 0201 type (codified format according to international EIAJ standard: length and width in hundredths of inches, the 2 or 3 first digits of the code representing the length and the last 2 digits representing the width. For a 0201 component the dimensions are therefore: length of the component 0.6±0.03 mm, width of the component 0.3±0.03 mm and dimension of the terminal to be soldered parallel to the length 0.15±0.05 mm). In contrast, the inventors have also found that if X is equal to 400±50 µm, Y is equal to 300±50 µm and S is equal to 300±50 µm, then the tombstone effect occurs only in less than 1% of cases, for a component of 0201 type. It is therefore the aforementioned values of X, Y and S that are advantageously adopted in the example of an embodiment described in this document. More generally, the tombstone effect is reduced if the distance S between the connection pads 16, is less than, equal to or close to that corresponding to the length of the component minus twice the dimension of the terminal to be soldered parallel to the length. In other words, the electronic component 7 has two longitudinal ends and a terminal to be soldered at each longitudinal end, and the distance between the terminals is greater, equal to or close to the distance S between the respective connection pads 16. More general component dimensions are indicated below. Optionally, the values of X, Y and S will possibly be modified, knowing that, on the one hand, if the distance S decreases, the component rests more on the reflowed solder and, on the other hand, if the area of the connection pads 16 is decreased, the forces tending to make the component revolve away are lower. Either or both of these two effects allow the frequency of appearance of the tombstone effect to be limited.

An example of a process for manufacturing one example of an embodiment of a first module 2 is described below with reference to FIG. 6.

This process comprises providing a complex material 100 comprising a substrate 9 made of dielectric material, to which substrate is laminated a first layer 21 or foil made of a first electrically conductive material (see FIG. 6a). For example, the dielectric material of the substrate 9 is a polyimide or an epoxy-glass composite the thickness of which is comprised between 25 and 100 microns, and is preferably equal to 100 microns, and the first layer 21 of electrically conductive material is made of copper or an alloy of copper the thickness of which is comprised between 12 and 70 microns, and is preferably equal to 35 microns.

To achieve an implementation of the process according to the invention that is high-performance from the industrial point of view, this complex material 100 is advantageously provided in a roll and the process is implemented reel-to-reel. The complex material 100 may be provided in the form of a clad, a copper clad for example. Alternatively, it may be provided in the form of a multilayer complex (not shown) comprising a dielectric substrate 9, a first layer 21 of electrically conductive material, and a layer of adhesive material (an epoxy for example) between the dielectric substrate and the first layer of electrically conductive material. The adhesive material for example has a thickness comprised between 10 and 25 microns. This multilayer complex 100 undergoes lamination. The adhesive material possibly undergoes a continuous drying operation in order to remove solvents present in the formulation when it is deposited. The layer of adhesive material thus allows the first layer of electrically conductive material to be fastened to the first face 10 of the dielectric substrate 9. The lamination may possibly be followed by an operation of curing the adhesive material thermally. The use of a stratified complex material (with no adhesive layer between the first main face 10 of the substrate and the first layer 21 of electrically conductive material) is preferable because it may allow problems with flow of the adhesive during the reflow operation described below to be avoided, and because it may allow problems with adhesion of the connection wires 17 during the operation of connecting the chip 5 to connection pads to be avoided.

Advantageously, the process also comprises an operation (not shown) in which a layer of adhesive material (which layer is different from the layer that has potentially already been deposited, as explained above) is deposited, for example with a thickness comprised between 10 and 25 microns, on the second main face 11 of the substrate 9. This layer of adhesive material (an epoxy for example) also possibly undergoes a continuous drying operation in order to remove solvents present in the formulation when it is deposited.

The complex material 100 therefore advantageously comprises a dielectric substrate 9 bearing a first layer 21 of electrically conductive material on its first main face 10 and a layer of adhesive material on its second main face 11. The complex material 100 thus formed then undergoes a perforating operation (which is advantageously mechanical, but which may optionally be carried out by laser cutting) to form connection wells 18 (see FIG. 6b) and driving holes 22 (see FIGS. 3 and 4). The connection wells 18 and the driving holes 22 pass right through the complex material 100 (substrate 9, first layer 21 of electrically conductive material, optional layer of adhesive material between the substrate and the first layer 21 of conductive material, and another layer of adhesive material).

The complex material 100 thus perforated undergoes an operation of lamination with a second layer 23 of electrically conductive material. This second layer 23 of conductive material obturates at least certain of the connection wells 18 to form blind holes (see FIG. 6c).

There then follow photolithography operations allowing connection pads 15, 16 and connection tracks 14 to be produced on the first main face 10, and contacts 13 to be produced on the second main face 11. These steps for example comprise operations of laminating a dry photoresist film to the first and second layers 21, 23 of conductive material covering the first and second main faces 10, 11 of the substrate 9, operations of exposing these photoresist films through masks, developing the photoresist and etching certain regions of the first and second layers 21, 23 of conductive material, to form connection pads 15, 16, connection tracks 14 or any other pattern.

Alternatively, connection pads 15, 16 and connection tracks 14 are produced by cutting or etching the first layer 21 of electrically conductive material (lead-frame technology) before laminating them to the first main face 10 of the dielectric substrate 9.

Operations of electrodepositing metal layers 24 (of copper, nickel, gold, palladium, silver or alloys thereof for example) are advantageously carried out on both/either of the first and second main faces 10, 11 of the substrate 9. These depositions are for example intended to facilitate soldering of connection wires 17 to the connection pads 15, 16.

A solder mask 20 is then deposited around the second connection pads 16 intended to receive a solder 25 (see FIGS. 6e and 6f). Advantageously, the solder mask 20 is made of a photo-imageable epoxy material. This more precisely allows, notably reel-to-reel, patterns to be produced that encircle the second connection pads 16. The solder mask 20 has a thickness comprised between 13 microns and 58 microns, and preferably equal to 38 microns.

There follows an operation of depositing a solder 25 on the second connection pads 16 encircled by the solder mask 20 and intended to be connected to an electronic component 7 (see FIGS. 6f and 6g). For example, the solder 25 is composed of an alloy of tin (96.5%), of silver (3%) and of copper (0.5%) known by the denomination "SAC 305", and the melting point of which is about 220° C. This operation of depositing a solder 25 is for example carried out by contact dispensing or by jetting or by screen-printing or by pin transfer. Deposition by jetting or contact dispensing is advantageous when the electronic component 7 is of small size because the size of the droplet of solder 25 must be small enough for the placement of the component to be made possible and reliable. For example, for the placement of components of 0201 or 01005 codified format, it is desirable for the diameter of the droplets of solder 25 to not exceed 200 microns, this being more easily achievable with jetting or contact dispensing than with screen-printing.

One or more electronic components 7 are then deposited on the second connection pads 16 on which a droplet of solder 25 has been deposited beforehand (see FIG. 6g). The one or more electronic components 7 are for example passive components. More particularly, it may be a question of capacitors allowing the capacitance of the antenna circuit present in the card body 6 and connected to the first module 2 to be matched. For example, such electronic components 7 have a generally parallelepipedal shape with a total length comprised between 0.4 and 1.0 mm, a width comprised between 0.2 and 0.5 mm and a height comprised between 0.2 and 0.5 mm. At each longitudinal end of these parallelepipeds are formed electrically conductive terminals that extend over the entire width and the entire height of the electronic components 7 and over a segment of the dimension corresponding to the length of these electronic components 7. These electronic components 7 are placed on the second connection pads 16 using a pick-and-place technique. It generally costs less to implement these solderable electronic components 7 than to implement electronic components 7 to be connected using wires. In FIG. 4, two regions 26, 27 of connection pads 15 have been shown. In a first region 26, two connection pads 15 have been produced with a view to connecting one electronic component 7 therebetween. In a second region 27, four connection pads 15 have been produced with a view to connecting two electronic components 7. Thus, it is possible to connect a variable number of electronic components 7 depending on the requirements.

Next, the circuit obtained beforehand is subjected to a reflow with a temperature profile having a peak at 250° C., in order to reflow the droplets of solder 25 deposited on the second connection pads 16. The solder mask 20 allows the spread and the height of the droplets of solder 25 during the reflow operation to be controlled.

A chip 5 is then deposited on the first face of the substrate and is connected to the second connection pads 16 using electrically conductive wires 17. This connection is achieved by ultrasound.

An encapsulating material 26 (a resin) is then deposited on the chip 5 and the wires 7 in order to protect them. In order to not add too much thickness to the first module 2, the encapsulating material 26 may not be deposited on the electronic components 7. Alternatively, the encapsulating material 26 is also deposited on one or more electronic components 7. If necessary, the cavity in which the first module 2 must be housed is milled to a larger depth in the card body 6.

All the operations described above are advantageously implemented continuously roll-to-roll.

In the above description, the operations of placing and connecting the chip 5 were carried out after the operations of placing and connecting the electronic components 7. According to one variant, the order of these operations is inverted.

Above, a process was described that comprised providing a complex material 100 comprising a substrate 9 made of dielectric material to which was laminated a first layer 21 or foil made of a first electrically conductive material, then to which substrate was added a second layer 23 of electrically conductive material, after perforation of the connection wells 18. Alternatively, the process comprises providing a complex material (not illustrated) comprising a dielectric substrate or carrier to each of the faces of which are laminated the first and second layers of electrically conductive material. The connection wells are then formed using a laser beam, through the first layer of electrically conductive material and the substrate.

The invention claimed is:

1. A chip-card module comprising a dielectric substrate bearing a first layer of electrically conductive material on a first main face of the substrate, a second layer of electrically conductive material on a second main face of the substrate, an integrated circuit securely fastened to the substrate, on the side of its first main face, and connected to first connection pads using wires, wherein at least one solderable electronic component is connected to second connection pads formed in the first layer of electrically conductive material, using a meltable solder deposited and reflowed on the second connection pads, the solder having a melting point comprised between 130° C. and 250° C. and being an alloy comprising at least two elements from the following list: bismuth, tin, silver and copper.

2. The chip-card module according to claim 1, wherein the electronic component is a passive component.

3. The chip-card module according to claim 1, wherein an encapsulating material surrounds the integrated circuit, without covering the electronic component.

4. The chip-card module according to claim 1, wherein the electronic component has two longitudinal ends and a terminal to be soldered at each longitudinal end, the distance between the terminals being greater or Equal to the distance between the respective connection pads.

5. A chip card module comprising a dielectric substrate bearing a first layer of electrically conductive material on a first main face of the substrate, a second layer of electrically conductive material on a second main face of the substrate, an integrated circuit securely fastened to the substrate, on the side of its first main face, and connected to first connection pads, wherein at least one solderable electronic component is connected to second connection pads formed in the first layer of electrically conductive material, using a meltable solder deposited and reflowed on the second connection pads, wherein the electronic component has two longitudinal ends and a terminal to be soldered at each longitudinal end, the distance between the terminals being greater or equal to the distance between the respective connection pads, wherein the second connection pads have a length equal to 400±50 µm, a width equal to 300±50 µm and wherein the distance between the second connection pads is equal to 300±50 µm.

6. A chip card comprising a card body and a cavity in which is housed the chip-card module according to claim 1.

7. The chip-card module according to claim 1, wherein the solder has the characteristics of a solder deposited using a technique chosen from at least one of:
- jetting,
- contact dispensing,
- pin transfer, or
- screen-printing.

\* \* \* \* \*